United States Patent [19]

Baskett

[11] Patent Number: 4,730,275

[45] Date of Patent: Mar. 8, 1988

[54] CIRCUIT FOR REDUCING THE ROW SELECT VOLTAGE SWING IN A MEMORY ARRAY

[75] Inventor: Ira E. Baskett, Tempe, Ariz.

[73] Assignee: Motorola, Inc., Schaumburg, Ill.

[21] Appl. No.: 800,875

[22] Filed: Nov. 22, 1985

[51] Int. Cl.$^4$ .............................................. G11C 7/00
[52] U.S. Cl. ................................... 365/174; 365/190; 365/155; 365/176; 307/449
[58] Field of Search ............... 365/155, 179, 190, 174; 307/449, 463

[56] References Cited

U.S. PATENT DOCUMENTS

| 4,460,984 | 7/1984 | Knepper | 365/179 |
| 4,646,268 | 2/1987 | Kuro | 365/179 |

FOREIGN PATENT DOCUMENTS 56-140586 11/1981 Japan ................................... 365/176

59-229785 12/1984 Japan ................................... 365/155

*Primary Examiner*—Joseph A. Popek
*Assistant Examiner*—Alfonso Garcia
*Attorney, Agent, or Firm*—William E. Koch

[57] ABSTRACT

A circuit reduces the row select voltage swing in a memory array, thereby reducing access time, power dissipation, disturb problems, glitches on the output, and alpha particle sensitivity. A row driver transistor is coupled between a first voltage source and the word line of a row of memory cells and has a base coupled to a row decode signal. A clamp circuit coupled to the base clamps a voltage on the base in accordance with a current provided by a current mirror coupled thereto. A write enable circuit is differentially connected to the current mirror and the clamp circuit for enabling the clamp circuit during a read mode for limiting the voltage swing on the word line.

1 Claim, 4 Drawing Figures

CIRCUIT FOR REDUCING THE ROW SELECT VOLTAGE SWING IN A MEMORY ARRAY

FIELD OF THE INVENTION

This invention relates generally to bipolar memory cells and, more particularly, to a circuit for reducing the swing of the voltage used to select a row of memory cells.

BACKGROUD OF THE INVENTION

Memory cells are circuits wherein information may be stored in a low current stand-by mode and may be written or read in a higher current mode. A predetermined number of cells are located in a row between each of a plurality of upper and lower word lines and another predetermined number of cells are located in a column between a plurality of bit lines. In other words, each cell is uniquely coupled between a combination of word lines and bit lines.

A row of cells is selected when increased voltage is supplied to the upper word line. A particular cell in that row is read by a sense amplifier coupled to the bit lines. A first read current through one bit line flows directly to the sense amplifier. A second read current through the other bit line flows through one side of the memory cell to the upper word line. When a cell is written, the first read current is directed through the cell and the second read current is directed to the sense amplifier.

Access time refers to the time required to raise the voltage on a the upper word line of a selected row of cells. This must be accomplished before the write signal causes current to flow through the appropriate bit line to write the cell. As memories are manufactured with more cells within the array, a larger current, i.e., higher power dissipation, is required to hold the deselected row down. Also, access time of resistor load memory cells is limited.

Conventional memory circuits have used a row swing that is equal for read and write. In these known circuits, if the voltage of a deselected row is too high, current will be provided to the sense amplifier through the bit line and the selected row may not write. Also, if the sense amplifier threshold is set too low, the selected cell may write inadvertently in the read mode. The row swing and sense amplifier threshold are therefore set by the write mode requirements.

One previously known memory circuit uses a clamp coupled to the base of an NPN transistor supplying current to the upper word line. This eliminates the slowest part of the RC rise time of the voltage applied to the upper word line.

However, the row rise time and therefore the row access time is limited by the AC response time of the cell, which if exceeded, will cause the cell to switch states (disturb). This limit can only be improved for a given cell by reducing the row swing. Also, glitches on the output occur because the state of the output is determined by comparing each side of the memory cell independently with a sense amplifier threshold voltage. If the selecting row is faster or slower than the deselecting row, either two rows or no rows are selected, causing a low-to-low or high-to-high output slitch. Furthermore, one factor in alpha particle sensitivity of a bipolar memory cell is the relative time a cell spends in a destabilized state due to row transitions. The larger the row swing, the more destabilized the cell becomes.

Therefore, a circuit is needed for reducing the swing of the voltage used to select a row of memory cells in the read mode for reducing access time, reducing power dissipation, reducing disturb problems, reducing glitches on the output, and reducing alpha particle sensitivity.

SUMMARY OF THE INVENTION

Accordingly, it is an object of the present invention to provide an improved memory circuit.

Another object of the present invention to provide an improved memory circuit having reduced access time.

Yet another object of the present invention to provide an improved memory circuit having reduced power dissipation.

Still another object of the present invention to provide an improved memory circuit having reduced disturb problems within the memory cells.

A further object of the present invention to provide an improved memory circuit having reduced glitches on the output.

Another object of the present invention to provide an improved memory circuit having reduced alpha particle sensitivity.

In carrying out the above and other objects of the invention in one form, there is provided an improved memory circuit including a first voltage terminal, a second voltage terminal, a plurality of word lines, a plurality of current drain lines, a plurality of bit lines, and a plurality of memory cells. The plurality of memory cells are arranged in a matrix of rows and columns, wherein each of the cells in a row is coupled between one of the word lines and one of the current drain lines, and each of the cells in a column are coupled between a pair of bit lines. A current source is coupled to the bit lines for sinking current therefrom. A decode circuit is coupled between the current source and the bit lines for enabling the current. A sense amplifier is coupled to the bit lines for sensing current in each of the bit lines. A transistor is coupled between the first voltage terminal and each of the word lines and is responsive to a row decode signal. A current mirror coupled between the first and second voltage terminal establishes a current. A clamp circuit is coupled between the control electrode and the current mirror. A write enable circuit is differentially connected to the current mirror and the clamp circuit for enabling the clamp circuit during a read mode for limiting the voltage swing on the word line.

The above and other objects, features, and advantages of the present invention will be better understood from the following detailed description taken in conjunction with the accompanying drawing.

DETAILED DESCRIPTION OF THE INVENTION

Figures 1, 3:
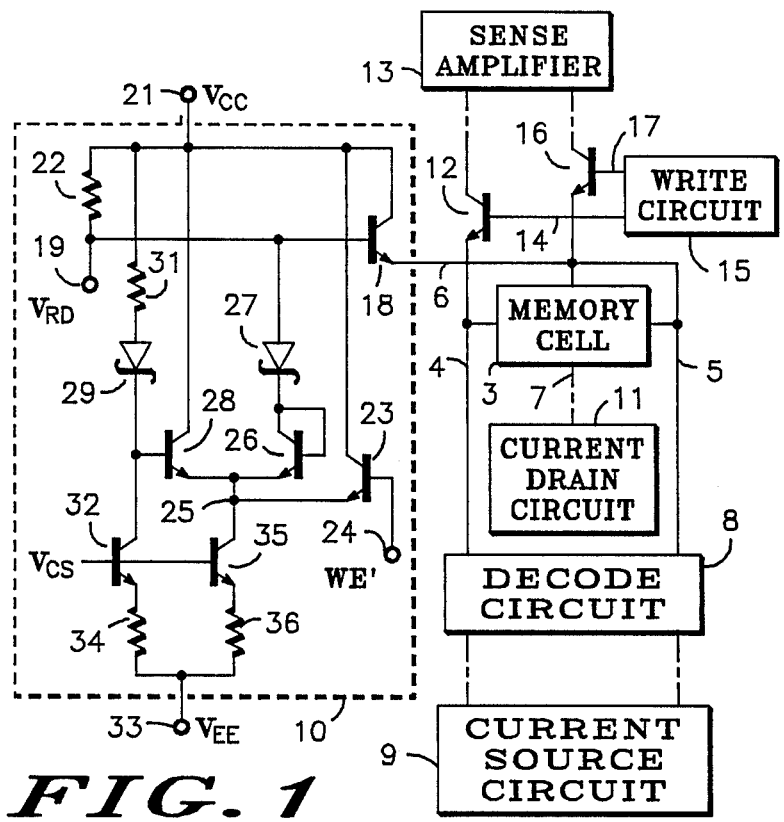
FIG. 1 is a partial block diagram and schematic of the preferred embodiment of the invention.
FIG. 3 is a schematic of a second embodiment of the invention.

Referring to FIG. 1, memory cell 3 is coupled between bit lines 4 and 5, and between word line 6 and current drain line 7, in a manner well known to those skilled in the art. There are a varity of bipolar memory cells known in the art, any of which may be used with this invention.

Decode circuitry 8 is coupled between current source circuit 9 and bit lines 4 and 5. Current drain circuit 11 is coupled to current drain line 7 for sinking current therefrom. NPN transistor 12 has an emitter coupled to bit line 4, a collector connected to sense amplifier 13 and a base connected to output 14 of write circuit 15. NPN transistor 16 has an emitter coupled to bit line 5, a collector connected to sense amplifier 13 and a base connected to output 17 of write circuit 15. As reflected by the dotted lines in the portion of the figure just described, a single sense amplifier 13, write circuit 15, current source circuit 9 and current drain circuit 11 are coupled to a plurality of memory cells 3, decode circuits 8, and transistors 12 and 16 that define the row of cells of the array.

Word line circuit 10 provides voltage to word line 6 and includes transistor 18 having a base connected to input terminal 19 for receiving a row decode signal $V_{RD}$, a collector connected to supply voltage terminal 21, and an emitter connected to word line 6 for supplying current to memory cell 3. Input terminal 19 is coupled to supply voltage terminal 21 by resistor 22 for setting the bias voltage of transistor 18. The above described conventional circuitry functions in a manner well known to those skilled in the art.

According to a preferred embodiment of the present invention, NPN transistor 23 has a base connected to terminal 24 for receiving write enable signal WE', a collector connected to supply voltage terminal 21, and an emitter connected to node 25. NPN transistor 26 has an emitter connected to node 25, and a base and a collector connected to the cathode of Schotky diode 27. The anode of diode 27 is connected to the base of transistor 18. NPN transistor 28 has a collector connected to supply voltage terminal 21, an emitter connected to node 25, and a base connected to the cathode of diode Schotky 29. The anode of diode 29 is coupled to supply voltage terminal 21 by resistor 31. Current source NPN transistor 32 has a base coupled for receiving current source bias voltage $V_{CS}$, a collector connected to the base of transistor 28, and an emitter coupled to supply voltage terminal 33 by resistor 34. Current source NPN transistor 35 has a base coupled for receiving current source bias voltage $V_{CS}$, a collector connected to node 25, and an emitter coupled to supply voltage terminal 33 by resistor 36.

This circuitry provides a reduced voltage swing on word line 6 during the read mode and a full voltage swing during the write mode. During the read mode, write enable signal WE' is low; therefore, transistor 23 is biased off. Transistor 28 is biased by resistor 31 and diode 29 so that differentially connected transistor 26 will clamp the base of transistor 18, and therefore word line 6, to a lower than normal level.

During the write mode, write enable signal WE' is high, causing the current through transistor 35 to divert from transistor 26 to transistor 23, thereby allowing the voltage on word line 6 to swing high. This causes peturbations in memory cell 3, resulting in an increased ability to write memory cell 3. As memory cell 3 is written, the low side is pulled up faster than the high side.

Figure 2:
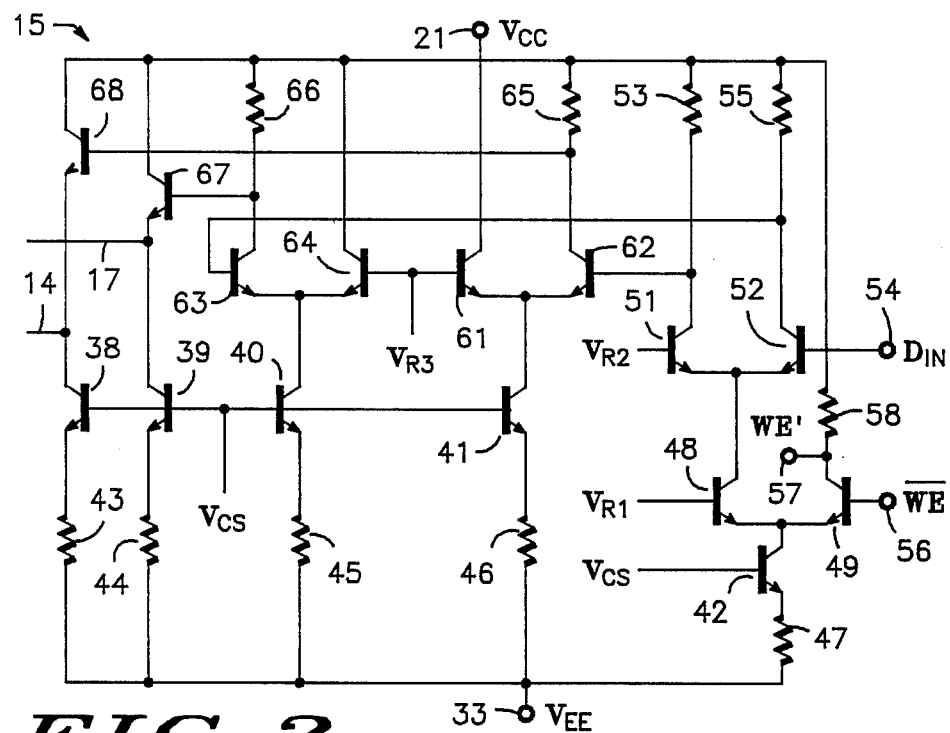
FIG. 2 is a schematic of the write circuit of FIG. 1.

Referring to FIG. 2, write circuit 15 comprises current source transistors 38, 39, 40, 41 and 42 which have their bases coupled for receiving current source bias voltage $V_{CS}$ and their emitters coupled to supply voltage terminal 33 by resistors 43, 44, 45, 46 and 47, respectively. The collector of transistor 42 is connected to the emitters of differentially connected transistors 48 and 49. Transistor 48 has a base coupled for receiving reference voltage $V_{R1}$, and a collector connected to the emitters of differentially connected transistors 51 and 52. Transistor 51 has a base coupled for receiving reference voltage $V_{R2}$, and a collector coupled to supply voltage terminal 21 by resistor 53. Transistor 52 has a base connected to terminal 54 for receiving data input signal $D_{IN}$, and a collector coupled to supply voltage terminal 21 by resistor 55. Transistor 49 has a base connected to terminal 56 for receiving write enable signal $\overline{WE}$, and a collector both connected to terminal 57 for supplying write enable signal WE' and coupled to supply voltage terminal 21 by resistor 58 Differentially connected transistors 61 and 62 and differentially connected transistors 63 and 64 have their emitters connected to the collectors of transistors 40 and 40, respectively. Transistors 61 and 64 have their bases coupled for receiving reference voltage $V_{R3}$ and their collectors connected to supply voltage terminal 21. Transistor 62 has a base connected to the collector of transistor 51, and a collector coupled to supply voltage terminal 21 by resistor 65. Transistor 63 has a base connected to the collector of transistor 52, and a collector coupled to supply voltage terminal 21 by resistor 66. Transistor 67 has a base connected to the collector of transistor 63, a collector connected to supply voltage terminal 21, and an emitter connected both to the collector of transistor 39 and output 17. Transistor 68 has a base connected to the collector of transistor 62, a collector connected to supply voltage terminal 21, and an emitter connected both to the collector of transistor 38 and output 14.

Write circuit 15 as illustrated in FIG. 2 establishes the read threshold on bit lines 4 and 5 by biasing the bases of transistors 12 and 16. This threshold is set to match the reduced high level of the row of memory cells 3 and may be centered between selected and deselected rows to eliminate output glitches. During the write mode, one of the outputs 14 or 17 is pulled up to match the new high level. The state of signal $D_{IN}$ determines which base of transistors 62 or 63 is biased, and therefore, which output 14 or 17 is high. A high write enable signal WE will bias transistor 49 on, and transistor 48 off. This causes outputs 14 and 17 to maintain a low state.

The time needed to traverse a smaller row swing results in a faster access time. A larger resistor 22 may be used to maintain present access time with reduced power dissipation. The row swing can be reduced to a value less than the cell voltage in which case the cell cannot be disturbed by the row. A reduced row swing improves cell stability and therefore reduces sensitivity to alpha particles.

Referring to FIG. 3, a second embodiment of word line pull up circuit 10 is shown wherein transistor 69 has a collector connected to supply voltage terminal 21, a base coupled by resistor 70 to word line 6, and an emitter connected to word line 6. Transistor 71 has a collector connected to supply voltage terminal 21, a base coupled to supply voltage terminal 21 by resistor 72, and an emitter connected to the base of transistor 69. Multi-emitter transistor 73 has a collector and base connected to the base of transistor 71 and one or more emitters (1 through n) coupled for receiving one or more row decode signals $V_{RD}$(1 through m). Transistor 74 has a collector connected to supply voltage terminal 21, a base coupled by resistor 75 to supply voltage terminal 21, and an emitter connected to an emitter (n+1) of transistor 73. Current source transistors 76 and 77 have their bases coupled for receiving current source voltage $V_{CS}$, their emitters coupled to supply voltage terminal 33 by resistors 78 and 79, respectively, and their collectors connected to the emitters of differentially connected transistors 81 and 82, and differentially connected transistors 83 and 84, respectively. Transistors 81 and 83 have their bases coupled for receiving bias voltage $V_{BB}$. Transistors 82 and 84 have their bases coupled for receiving write enable signal WE. The collectors of transistors 81 and 83 are connected to supply voltage terminal 21. The collector of transistor 84 is connected to the base of transistor 74, and the collector of transistor 82 is connected to the emitter of transistor 74.

This embodiment shown in FIG. 3 provides a reduced voltage swing on word line 6 during the read mode and a full voltage swing during the write mode. During the write mode, write enable signal WE' is low; therefore, transistors 82 and 84 are biased off. Transistors 81 and 83 are biased on by voltage $V_{BB}$ and current through transistors 76 and 77, respectively. Transistor 74 is therefore non-conductive and no current flows from emitter n+1 of transistor 73. The selected row is pulled up to a full high level.

During the read mode, write enable signal WE' is high, causing the current through transistors 81 and 83 to divert to transistors 82 and 84, respectively. Therefore, current flows through transistor 82 from both transistors 73 and 74 causing the selected row voltage to be clamped to a lower level.

Figure 4:
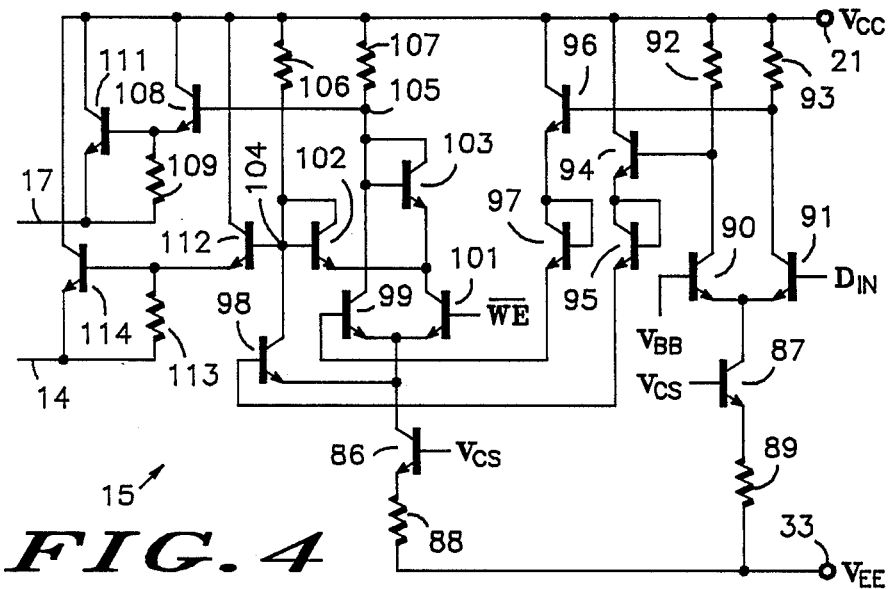
FIG. 4 is a schematic of the write circuit accompanying the second preferred embodiment of FIG. 3.

Referring to FIG. 4, the write circuit 15 of the second embodiment comprises current source transistors 86 and 87 having their bases coupled for receiving current source voltage $V_{CS}$ and their emitters coupled to supply voltage terminal 33 by resistors 88 and 89, respectively. The collector of transistor 87 is connected to the emitters of differentially connected transistors 90 and 91. Transistor 90 has a base coupled for receiving bias voltage $V_{BB}$ and a collector coupled to supply voltage terminal 21 by resistor 92. Transistor 91 has a base coupled for receiving input signal $D_{IN}$ and a collector coupled to supply voltage terminal 21 by resistor 93. Emitter follower transistor 94 has a base connected to the collector of transistor 90, a collector connected to supply voltage terminal 21, and an emitter connected to the base and collector of diode connected transistor 95. Emitter follower transistor 96 has a base connected to the collector of transistor 91, a collector connected to supply voltage terminal 21, and an emitter connected to the base and collector of diode connected transistor 97. The emitters of transistors 95 and 97 have their emitters connected to the bases of transistors 98 and 99, respectively. Transistors 98 and 99 are differentially connected to transistor 101, the emitters thereof being connected to the collector of transistor 86. Transistor 101 has a base coupled for receiving write enable signal WE and a collector connected to the emitters of transistors 102 and 103. The collectors of transistors 98 and 99 are connected to nodes 104 and 105, respectively. Nodes 104 and 105 are coupled to supply voltage terminal 21 by resistors 106 and 107, respectively.

Emitter-follower transistor 108 has a collector connected to supply voltage terminal 21, a base connected to node 105, and an emitter coupled to output 17 by resistor 109. Darlington transistor 111 has a collector connected to supply voltage terminal 21, a base connected to the emitter of transistor 108, and an emitter connected to output 17. Emitter-follower transistor 112 has a collector connected to supply voltage terminal 21, a base connected to node 104, and an emitter coupled to output 14 by resistor 113. Darlington transistor 114 has a collector connected to supply voltage terminal 21, a base connected to the emitter of transistor 112 and an emitter connected to output 14.

Write circuit 15 as illustrated in FIG. 4 establishes the read threshold on bit lines 4 and 5 by biasing the bases of transistors 12 and 16. This threshold is set to match the reduced high level of the row of memory cells 3 and may be centered between selected and deselected rows to eliminate output glitches. During the write mode, one of the outputs 14 or 17 is pulled up to match the new high level. The state of signal $D_{IN}$ determines which base of transistors 98 or 99 is biased, and therefore, which output 14 or 17 is high. A high write enable signal WE will bias transistor 101 on, and transistors 98 and 99 off. This causes outputs 14 and 17 to maintain a low state.

The time needed to traverse a smaller row swing results in a faster access time. A larger resistor 72 may be used to maintain present access time with reduced power dissipation. The row swing can be reduced to a value less than the cell voltage in which case the cell cannot be disturbed by the row. A reduced row swing improves cell stability and therefore reduces sensitivity to alpha particles.

By now it should be appreciated that there has been provided a memory cell circuit having variable row voltage swing for reducing access time, reducing power dissipation, reducing disturb problems, reducing glitches on the output, and reducing alpha particle sensitivity.

I claim:

1. A memory circuit having a read mode and a write mode, including a first voltage terminal and a second voltage terminal, said circuit comprising:
   a word line;
   a current drain line;
   a first bit line;
   a second bit line;
   a memory cell coupled between said word line and said current drain line and coupled between said first and second bit lines;
   first means coupled between said current drain line and said second voltage terminal for sinking current from said current drain line;
   second means coupled to said first and second bit lines for sensing current in said first and second bit lines;
   third means coupled between said second voltage terminal and both said first and second bit lines for sinking a current through said first and second bit lines;
   fourth means coupled between both said first and second bit lines and said fourth means for enabling current through said first and second bit lines;
   a first transistor coupled between said first voltage terminal and said word line and having a control electrode;
   a first resistor;
   a multi-emitter transistor having a first emitter, and one or more other emitters coupled as said inputs, a base and a collector coupled to said control electrode of said first transistor and coupled to said first voltage terminal by said first resistor;

a first current source;

a second current source;

a second resistor;

a second transistor having a collector coupled to said first voltage terminal, a base coupled to said first voltage terminal by said second resistor, and an emitter coupled to said first emitter of said multi-emitter transistor;

a first pair of differentially connected transistors having their emitters coupled to said second voltage terminal by said first current source, their collectors coupled to said first voltage terminal and said emitter of said second transistor, respectively, and their bases coupled to receive a reference voltage and an enable signal, respectively; and a second pair of differentially connected transistors having their emitters coupled to said second voltage terminal by said second current source, their collectors coupled to said first voltage terminal and said first voltage terminal by said second resistor, respectively, and their bases coupled to said reference voltage and said enable signal, respectively.

* * * * *